(12) United States Patent
Yegnashankaran et al.

(10) Patent No.: US 7,790,602 B1
(45) Date of Patent: Sep. 7, 2010

(54) METHOD OF FORMING A METAL INTERCONNECT WITH CAPACITIVE STRUCTURES THAT ADJUST THE CAPACITANCE OF THE INTERCONNECT

(75) Inventors: Visvamohan Yegnashankaran, Redwood City, CA (US); Gobi R. Padmanabhan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 166 days.

(21) Appl. No.: 11/372,830

(22) Filed: Mar. 9, 2006

Related U.S. Application Data

(62) Division of application No. 10/010,696, filed on Dec. 5, 2001, now Pat. No. 7,042,092.

(51) Int. Cl.
*H01L 21/4763* (2006.01)
(52) U.S. Cl. .................. 438/622; 438/637; 438/700
(58) Field of Classification Search ......... 438/622–624, 438/787
See application file for complete search history.

(56) References Cited

U.S. PATENT DOCUMENTS

| | | | |
|---|---|---|---|
| 5,449,953 A | 9/1995 | Nathanson et al. | |
| 5,640,049 A | 6/1997 | Rostoker et al. | 257/758 |
| 5,744,865 A * | 4/1998 | Jeng et al. | 257/750 |
| 5,751,066 A * | 5/1998 | Havemann | 257/759 |
| 5,936,295 A * | 8/1999 | Havemann et al. | 257/522 |
| 6,100,590 A | 8/2000 | Yegnashankaran et al. | 257/758 |
| 6,207,553 B1 | 3/2001 | Buynoski et al. | 438/622 |
| 6,222,269 B1 * | 4/2001 | Usami | 257/758 |
| 6,246,118 B1 | 6/2001 | Buynoski | 257/758 |
| 6,262,446 B1 | 7/2001 | Koo et al. | 257/296 |
| 6,288,447 B1 | 9/2001 | Amishiro et al. | 257/758 |
| 6,294,834 B1 | 9/2001 | Yeh et al. | 257/758 |
| 6,362,531 B1 | 3/2002 | Stamper et al. | 257/781 |
| 6,437,441 B1 | 8/2002 | Yamamoto | 257/758 |
| 6,486,558 B2 | 11/2002 | Sugiyama et al. | 257/758 |
| 6,627,926 B2 | 9/2003 | Hartswick et al. | 257/211 |
| 6,777,320 B1 * | 8/2004 | Chiang et al. | 438/618 |
| 2002/0000664 A1 | 1/2002 | Cheng et al. | 257/758 |

* cited by examiner

*Primary Examiner*—Ori Nadav
(74) *Attorney, Agent, or Firm*—Mark C. Pickering

(57) ABSTRACT

A method of forming capacitive structures in trenches which have been formed in a multilevel metal interconnect structure is disclosed. The method of forming the capacitive structures allows the capacitance of the multilevel metal interconnect structure to be adjusted, and thereby optimized, to respond to signals from devices that are formed on an underlying substrate.

17 Claims, 11 Drawing Sheets

METHOD OF FORMING A METAL INTERCONNECT WITH CAPACITIVE STRUCTURES THAT ADJUST THE CAPACITANCE OF THE INTERCONNECT

This is a divisional application of application Ser. No. 10/010,696 filed on Dec. 5, 2001, now U.S. Pat. No. 7,042,092, issued on May 9, 2006.

BACKGROUND OF THE INVENTION

1. Field of the Invention

The present invention relates to multilevel metal interconnects and, more particularly, to a multilevel metal interconnect and method of forming the interconnect with capacitive structures that adjust the capacitance of the interconnect.

2. Description of the Related Art

A metal interconnect is a semiconductor structure that electrically connects the individual devices on the semiconductor substrate to realize a desired circuit function. Multiple layers of metal are typically needed to provide the required interconnections, with current-generation integrated circuits often employing up to seven layers of metal.

FIG. 1 shows a cross-sectional view that illustrates a conventional multilevel metal interconnect 100. As shown in FIG. 1, interconnect 100, which is formed on a semiconductor substrate 110, has a first layer of isolation material 112 that is formed on substrate 110, and a number of contacts 114 that are formed through isolation layer 112. In addition, interconnect 100 also has a patterned first metal (metal-1) layer 116 that is formed on isolation layer 112 and contacts 114. Contacts 114 provide an electrical connection with devices formed in substrate 110, such as a source or a drain region of a MOS transistor, while metal-1 layer 116 provides an electrical connection with contacts 114.

In addition, interconnect 100 has a second layer of isolation material 120, known as an intermetal dielectric, that is formed on metal-1 layer 116, and a number of vias 122 that are formed through isolation layer 120. Interconnect 100 also has a patterned second metal (metal-2) layer 124 that is formed on isolation layer 120 and vias 122. Vias 122 provide an electrical connection between patterned metal-1 layer 116 and patterned metal-2 layer 124.

In a similar fashion, interconnect 100 has third and fourth layers of isolation material 130 and 140, respectively. In addition, a number vias 132 are formed through isolation layer 130 to contact metal-2 layer 124, and a number vias 142 are formed through isolation layer 140.

Further, interconnect 100 has a patterned third (metal-3) layer 134 and a patterned fourth metal (metal-4) layer 144, respectively, that are formed to provide an electrical connection with vias 132 and 142, respectively. A passivation layer 146 is formed on the layer of fourth isolation material 140 and metal-4 layer 144.

Interconnect 100 is conventionally formed, in part, by depositing a first layer of metal on a first layer of isolation material and the contacts formed through the first layer of isolation material. Following this, the first layer of metal is patterned to form the patterned first metal layer. Next, a second layer of isolation material is formed on the patterned first metal layer and the first layer of isolation material.

Vias are then formed through the second layer of isolation material to form an electrical connection with the first layer of metal. A second layer of metal is then deposited on the second layer of isolation material and the vias, and the process continues until all of the required metal layers have been formed.

The layers of isolation material can be implemented with the same or different materials. Silicon dioxide (SiO2) is commonly used to form each of the isolation layers. Silicon nitride is also commonly used with silicon dioxide, while many current generation processes use dielectric materials with a dielectric constant (K) that is lower than silicon dioxide.

The layers of isolation material provide electrical isolation between the patterned metal layers as well as between metal lines within a given patterned metal layer. The metal-isolation material-metal structure forms a parasitic capacitor which has a capacitance that is partially defined by the dielectric constant (K) of the type of isolation material that is used.

Horizontally adjacent metal lines from a patterned metal layer have a line-to-line capacitance that is partially defined by the layer of isolation material formed between the metal lines. For example, horizontally adjacent metal lines from patterned metal-3 layer 134 have a line-to-line capacitance Ca that is partially defined by the fourth layer of isolation material 140.

In addition, vertically adjacent metal lines have an interlayer capacitance that is partially defined by the isolation material between the metal lines. For example, vertically adjacent metal lines from metal-3 and metal-4 layers 134 and 144, respectively, have an interlayer capacitance Cb that is partially defined by the fourth layer of isolation material 140.

Further, diagonally adjacent metal lines have a cross coupled capacitance partially defined by the isolation material between the metal lines. For example, diagonally adjacent metal lines from metal-3 and metal-4 layers 134 and 144, respectively, have a cross coupled capacitance Cc partially defined by the fourth layer of isolation material 140.

One problem with interconnect 100, particularly in submicron integrated circuits, is the RC time delay introduced by interconnect 100. The RC time delay, which is dominated by the line-to-line capacitance Ca, the interlevel capacitance Cb, and the cross coupled capacitance Cc, significantly impacts the speed of the electrical circuit that is formed on the underlying substrate.

U.S. Pat. No. 5,449,953 to Nathanson et al. describe a single level "airbridge" connecting structure for interconnecting monolithic microwave integrated circuits. The manufacturing of these highly specialized structures is, however, not compatible with standard CMOS or bipolar semiconductor device interconnect processing and these structures do not provide a supporting layer beneath the "airbridge."

U.S. Pat. No. 6,100,590 to Yegnashankaran et al. describe a multilevel metal interconnect where trenches are utilized to reduce the line-to-line and cross-coupled capacitances Ca and Cc. FIG. 2 shows a cross-sectional view that illustrates a prior-art multilevel metal interconnect 200. FIG. 2 illustrates the multilevel metal interconnect taught by U.S. Pat. No. 6,100,590.

Interconnect 200 is similar to interconnect 100 and, as a result, utilizes the same reference numerals to designate the structures that are common to both structures. As shown in FIG. 2, interconnect 200 differs from interconnect 100 in that interconnect 200 has a first trench 210 and a second trench 220.

First trench 210 is formed between horizontally adjacent metal lines from the patterned metal-4 layer 144, and through the fourth layer of isolation material 140. In addition, first trench 210 is formed between horizontally adjacent metal lines from the patterned metal-3 layer 134, and through the third layer of isolation material 130.

Second trench 220 is formed between horizontally adjacent metal lines from the patterned metal-4 layer 144, and through the fourth layer of isolation material 140. In addition, second trench 220 is formed between horizontally adjacent metal lines from the patterned metal-3 layer 134, and through the third layer of isolation material 130.

Second trench 220 is further formed between horizontally adjacent metal lines from the patterned metal-2 layer 124, and through the second layer of isolation material 120. In addition, second trench 220 is also formed between horizontally adjacent metal lines from the patterned metal-1 layer 116.

Trenches 210 and 220 are filled with air, which has a dielectric constant of 1.0. Compared with silicon dioxide, which has a dielectric constant of 3.9, the air in trenches 210 and 220 significantly reduces the line-to-line capacitance Ca and the cross-coupled capacitance Cc. The contributions of capacitance Ca and capacitance Cc to the total interconnect related capacitance depend on the particular geometry of the integrated circuit layout (e.g. metal line-to-line spacing, thickness of the interconnect dielectric material between metal layers, etc.). For conventional microprocessors, for example, capacitance Ca and capacitance Cc can account for 60-70% or more of the total capacitance related to interconnect 100.

Since the capacitance related to interconnect 100 is the dominant factor affecting the RC time delay in submicron integrated circuits, the presence of trenches 210 and 220 in the interconnect dielectric material reduces the capacitance related to interconnect 100, thereby increasing device speed.

BRIEF DESCRIPTION OF THE DRAWINGS

FIGS. 3A-6A are plan views illustrating a method of forming a multilevel metal interconnect 300 in accordance with the present invention.

FIGS. 3B-6B are cross-sectional views taken along lines 3B-3B to 6B-6B in FIGS. 3A-6A, respectively, in accordance with the present invention.

FIGS. 3C-6C are cross-sectional views taken along lines 3C-3C to 6C-6C in FIGS. 3A-6A, respectively, in accordance with the present invention.

FIGS. 7A-12A are plan views illustrating a method of forming a metal multilayer interconnect in accordance with a second alternate embodiment of the present invention.

FIGS. 7B-12B are cross-sectional drawings taken along lines 7B-7B to 12B-12B shown in FIGS. 7A-12A, respectively.

DETAILED DESCRIPTION

FIGS. 3A-6A show plan views that illustrate a method of forming a metal multilayer interconnect in accordance with the present invention.

FIGS. 3B-6B show cross-sectional drawings taken along lines 3B-3B to 6B-6B shown in FIGS. 3A-6A, respectively. FIGS. 3C-6C show cross-sectional drawings taken along lines 3C-3C to 6C-6C shown in FIGS. 3A-6A, respectively.

Figure 3A:
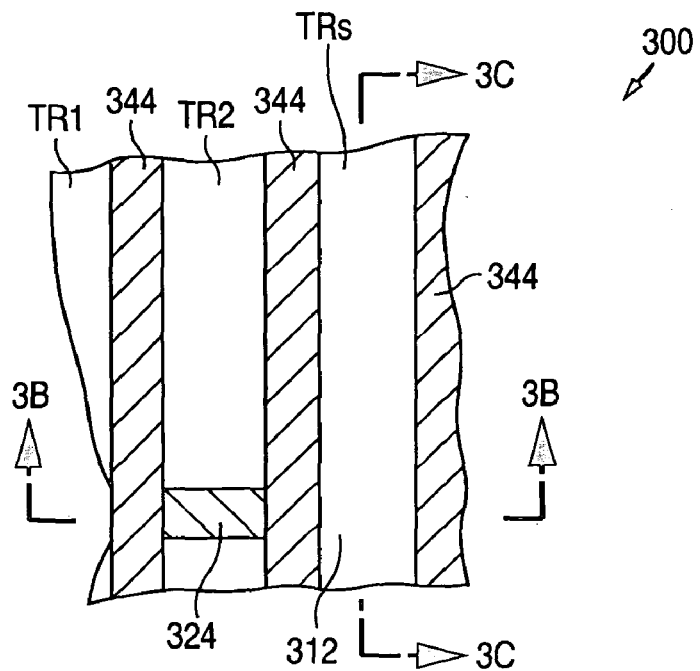
Figure 3B:
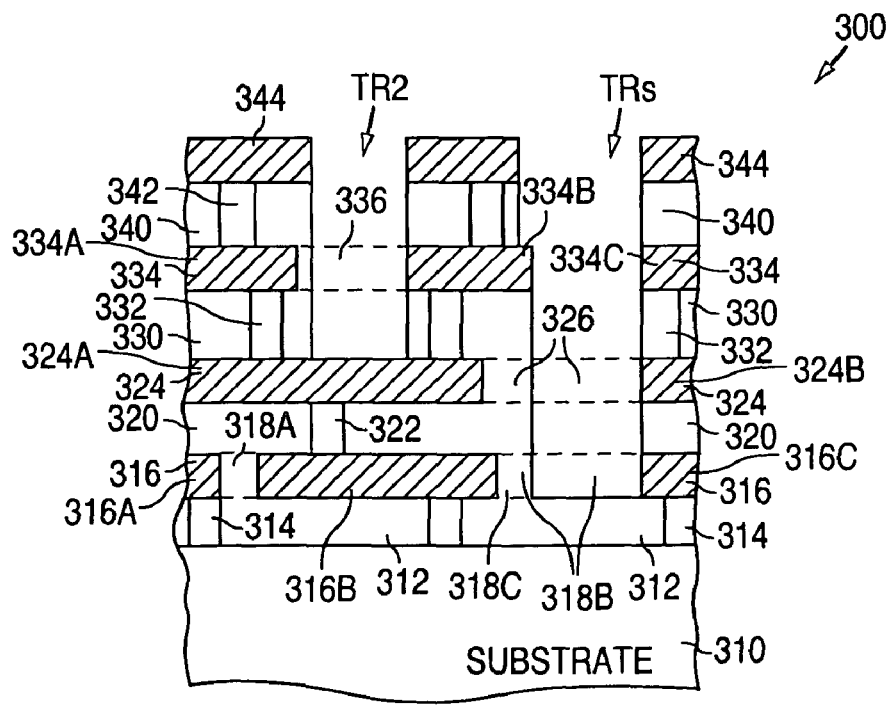
Figure 3C:
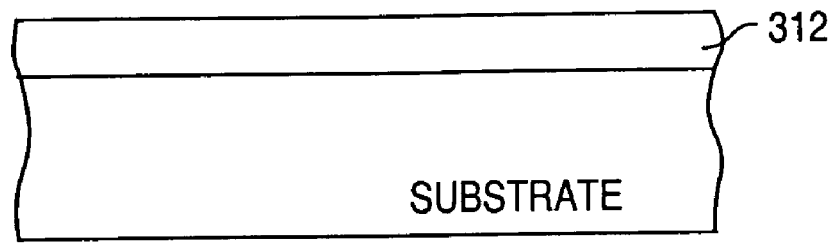

As shown in FIGS. 3A-3C, the method utilizes an interconnect 300 that is conventionally formed on a semiconductor substrate 310. Interconnect 300 includes a first layer of isolation material 312 that is formed on substrate 310, and a number of contacts 314 that are formed through isolation layer 312. Contacts 314 provide an electrical connection to active regions on the surface of substrate 310. Examples of active regions include the source region of a MOS transistor and collector region of a bipolar transistor.

As further shown in FIGS. 3A-3C, interconnect 300 also includes a patterned first metal (metal-1) layer 316 that is formed on isolation layer 312 and contacts 314. In the FIGS. 3A-3C example, patterned metal-1 layer 316 includes a first metal line 316A, a second metal line 316B, and a third metal line 316C. In addition, a first space 318A is defined to lie horizontally entirely between the first and second metal lines 316A and 316B, a second space 318B is defined to lie horizontally entirely between the second and third metal lines 316B and 316C, and a first region 318C is defined to lie within second space 318B and contact a side wall of second metal line 316B.

Further, interconnect 300 includes a second layer of isolation material 320 that is formed on isolation layer 312 and metal-1 layer 316. Interconnect 300 further includes a number of vias 322 that are formed through isolation layer 320, and a patterned second metal (metal-2) layer 324 that is formed on isolation layer 320 and vias 322. Vias 322 provide an electrical connection between patterned metal-1 layer 316 and patterned metal-2 layer 324. In the FIGS. 3A-3C example, patterned metal-2 layer 324 includes a fourth metal line 324A and a fifth metal line 324B. Further, a second region 326 is defined to lie horizontally entirely between the fourth and fifth metal lines 324A and 324B.

In addition, interconnect 300 includes a third layer of isolation material 330 that is formed on isolation layer 320 and metal-2 layer 324, and a number of vias 332 that are formed through isolation layer 330. Interconnect 300 further includes a patterned third metal (metal-3) layer 334 that is formed on isolation layer 330 and vias 332, and a fourth layer of isolation material 340 that is formed on the third layer of isolation material 330 and metal-3 layer 334. Patterned metal-3 layer 334 can include a sixth metal line 334A, a seventh metal line 334B, and an eighth metal line 334C. In addition, a third region 336 is defined to lie horizontally entirely between the sixth and seventh metal lines 334A and 334B. Isolation layers 312, 320, 330, and 340 can be implemented with, for example, a low-K dielectric.

Interconnect 300 also includes a number of vias 342 that are formed through isolation layer 340, and a patterned fourth metal (metal-4) layer 344 that is formed on isolation layer 340 and vias 342. Vias 332 provide an electrical connection between patterned metal-2 layer 324 and patterned metal-3 layer 334, while vias 342 provide an electrical connection between patterned metal-3 layer 334 and patterned metal-4 layer 344. (Although only four layers of metal are shown, the present invention applies any number of metal layers greater than one.)

The configuration or geometry of the patterned metal layers, such as layer thickness, metal line width, and metal line spacing and pitch, depends on the functionality of the integrated circuit device with which the multilevel metal interconnect will be used. In addition, the process technology used to manufacture the multilevel metal interconnect also effects the geometry of the patterned metal layers.

For example, metal-4 layer 344 can be, for example, as thick as 2 microns, while the remaining patterned metal layers that lie underneath can be, for example, 5000 to 6000 angstroms in thickness. The width of the metal lines for a 0.18-micron process technology can be, for example, 0.28 microns. The thickness of the isolation layers separating one patterned metal layer from the next is dependent upon the process technology used to manufacture the multilevel interconnect, and can be, for example, within the range of 6,000 to 10,000 angstroms.

As shown in FIGS. 3A-3C, the method of the present invention begins by anistropically etching interconnect 300 for a predetermined period of time to form a number of trenches TR1-TRs. The anisotropic etch has a high selectivity to metal (i.e. removes interconnect dielectric material at a significantly higher rate than removing metal) to prevent the metal layers from being adversely affected. Trenches TR1-TRs are substantially straight, and adjoin other trenches TR.

The top metal layer, metal-4 layer 344 in this example, functions as a mask for the etching step, with the remaining layers of metal functioning as an etch stop. Thus, depending on the metal patterns in interconnect 300, the bottom surface of a trench TR can have multiple levels, such as trench TR2 (which steps up and over patterned metal-2 layer 324), or a single level such as trench TRs.

Figure 1:
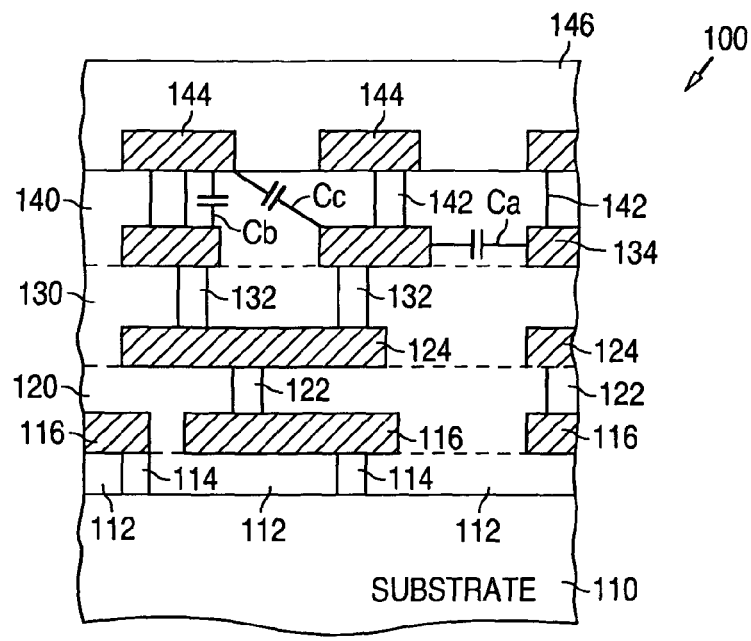
FIG. 1 is a cross-sectional view illustrating a conventional multilevel metal interconnect 100.
Figure 2:
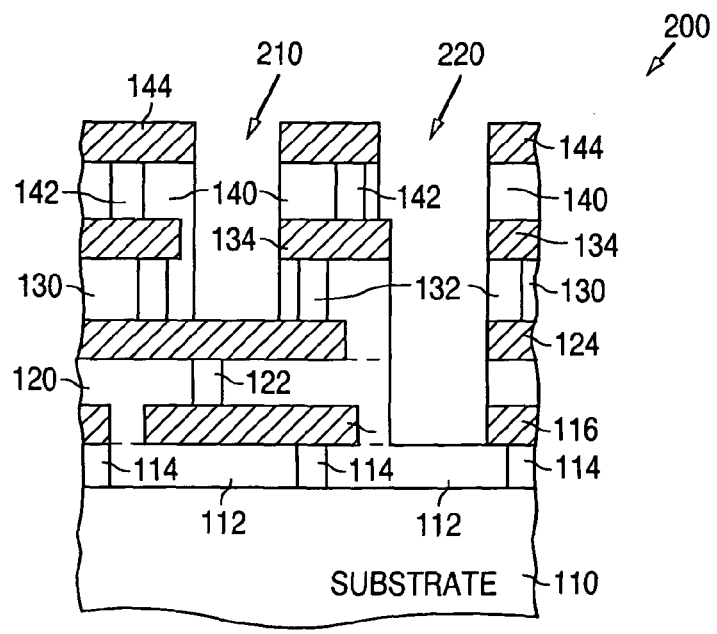
FIG. 2 is a cross-sectional view that illustrates a prior-art multilevel metal interconnect 200.

The predetermined period of time can be set to any time within a range that has a top end that insures that the etching step does not etch into substrate 310. Following the etching step, interconnect 300 is substantially the same as interconnect 200 shown in FIG. 2. As noted above, interconnect 200 illustrates the multilevel metal interconnect taught by U.S. Pat. No. 6,100,590, which is hereby incorporated by reference.

Figure 4A:
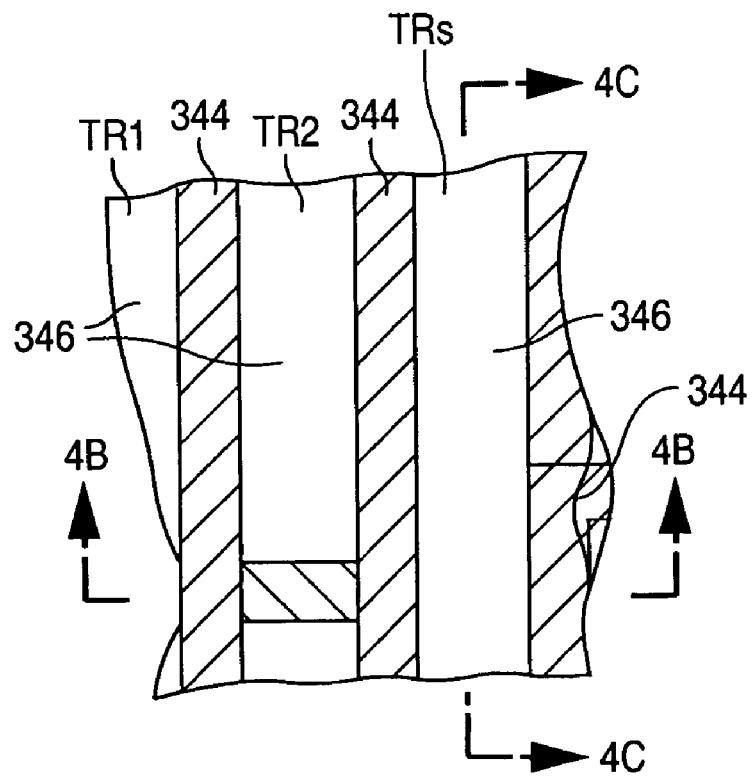
Figure 4B:
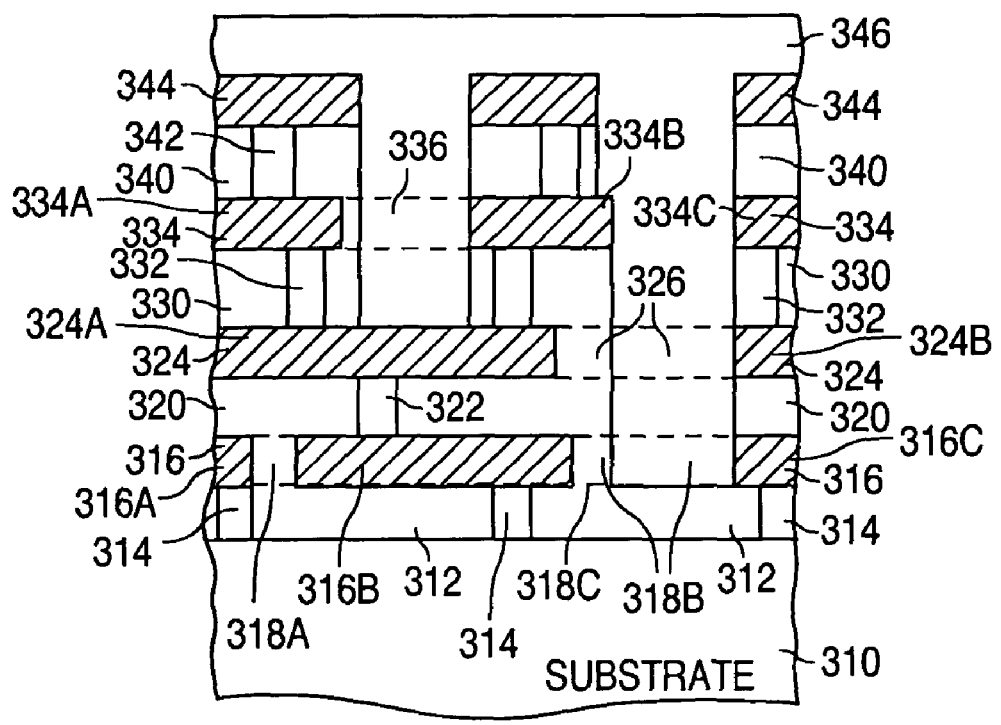
Figure 4C:
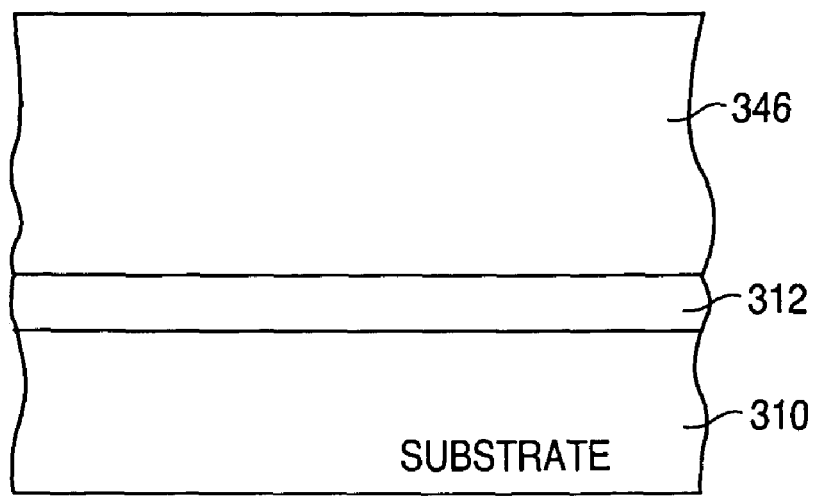

Referring to FIGS. 4A-4C, in accordance with the present invention, a layer of dielectric material 346 is next formed in trenches TR1-TRs. A single type of dielectric material, such as oxide, can be used to fill trenches TR1-TRs, or multiple types of dielectric can be used to fill trenches TR1-TRs (via sequential formation).

In the present invention, dielectric material 346 changes the line-to-line capacitance Ca and the cross coupled capacitance Cc of the metal lines in interconnect 300. As a result, the present invention provides a technique for adjusting the capacitance on a metal line to tune interconnect 300 to the operation of the electrical circuit formed on substrate 310.

Figure 5A:
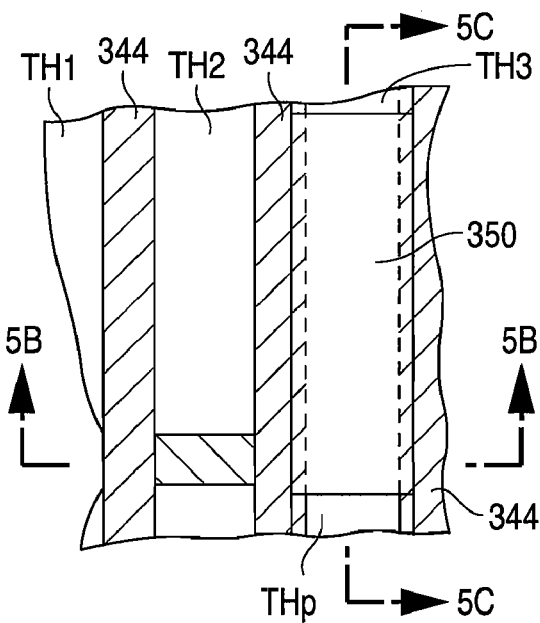
Figure 5B:
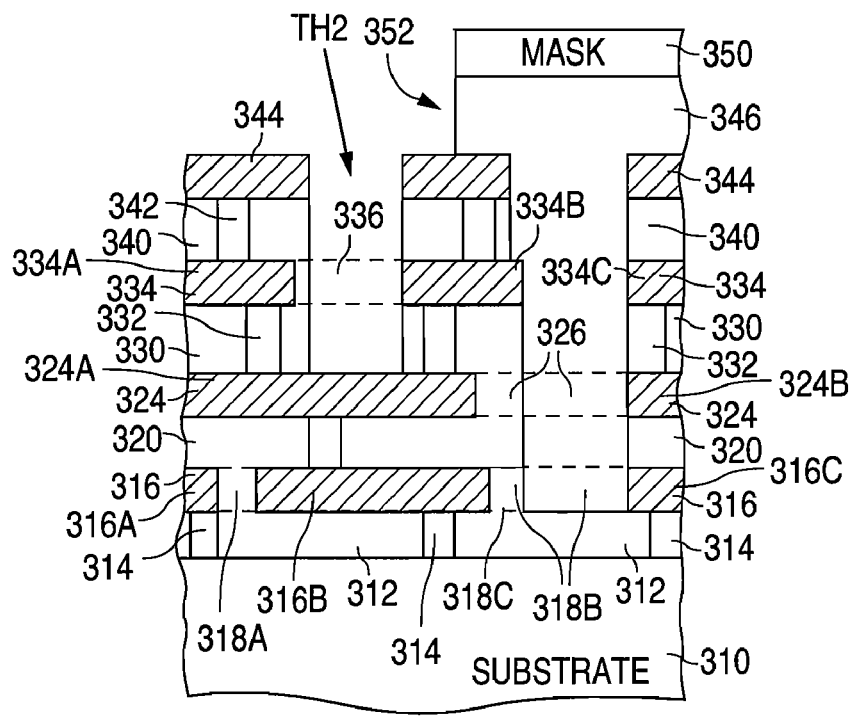
Figure 5C:
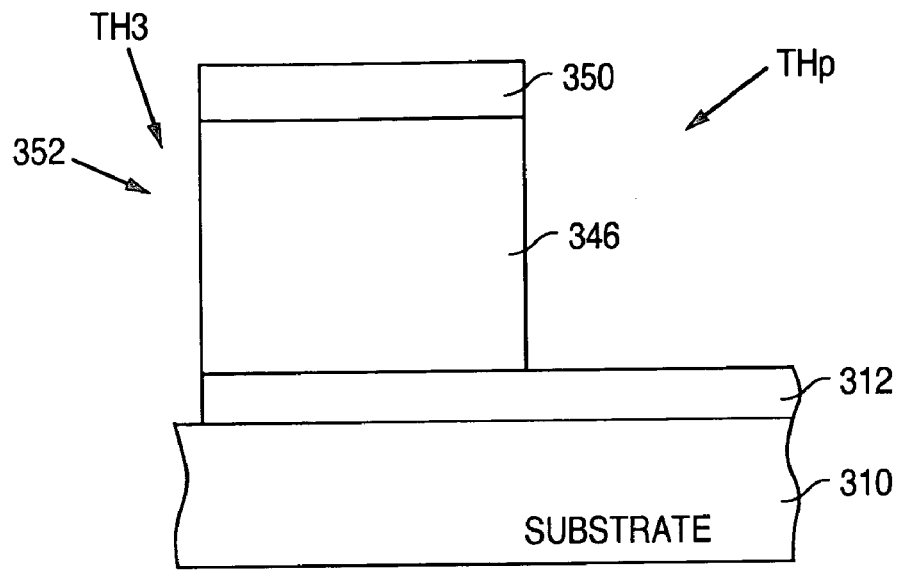

Referring to FIGS. 5A-5C, following the formation of dielectric material 346, a layer of masking material 350 is formed on the layer of dielectric material 346. Once formed, masking layer 350 is patterned to protect a capacitor region on the surface of dielectric material 346. Following this, the exposed regions of dielectric layer 346 are anisotropically etched to form one or more capacitive structures 352 and a number of trenches TH1-THp. After the etch, masking layer 350 is removed, and the method continues with conventional back end processing steps.

Thus, the present invention provides the air dielectric benefits of U.S. Pat. No. 6,100,590 to Yegnashankaran et al., plus the additional benefit of selectively adding capacitance to interconnect 300 to tune interconnect 300 with respect to the electrical circuit formed on the underlying substrate.

Figure 6A:
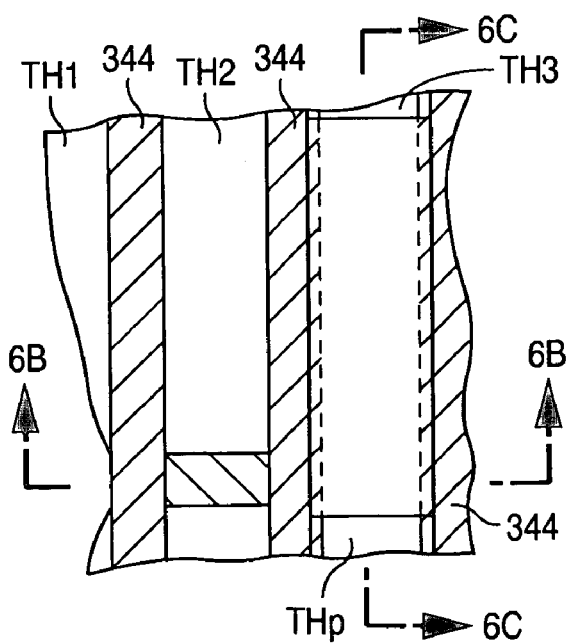
Figure 6B:
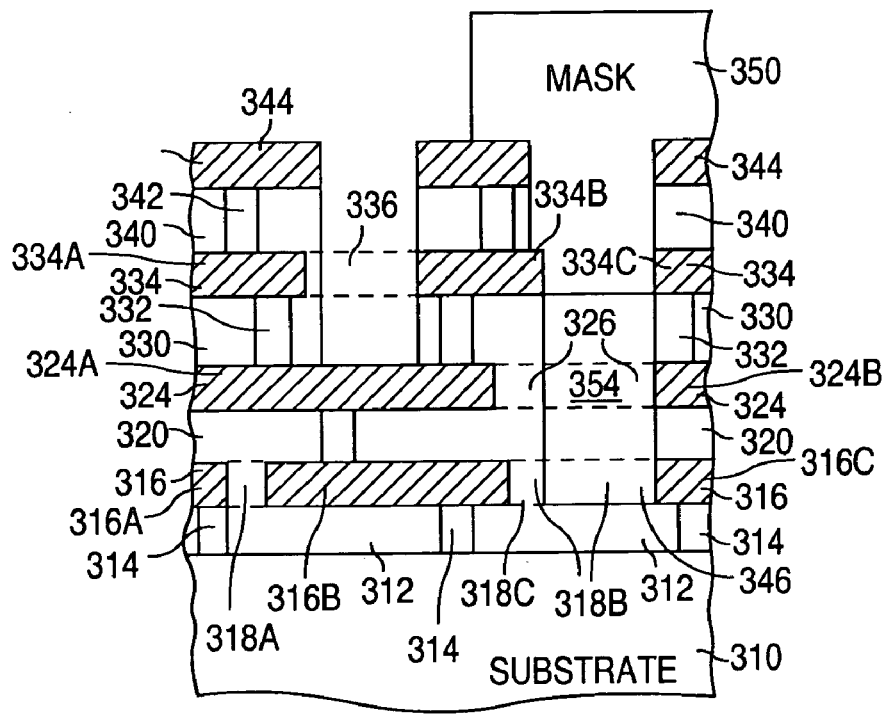
Figure 6C:
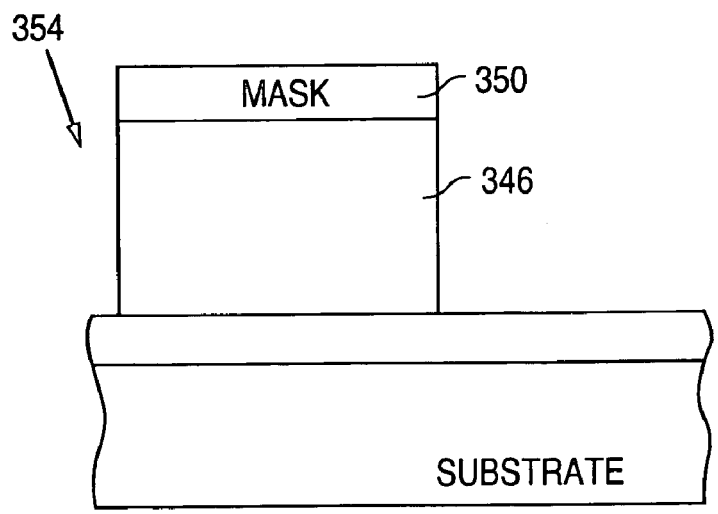

In a first alternate embodiment of the present invention, as shown in FIGS. 6A-6C, dielectric material 346 is anisotropically etched for a predetermined period of time prior to the formation of masking layer 350. By utilizing an anisotropic etch prior to forming the masking layer, a capacitive structure 354 with a shorter step height can be formed.

Figure 7A:
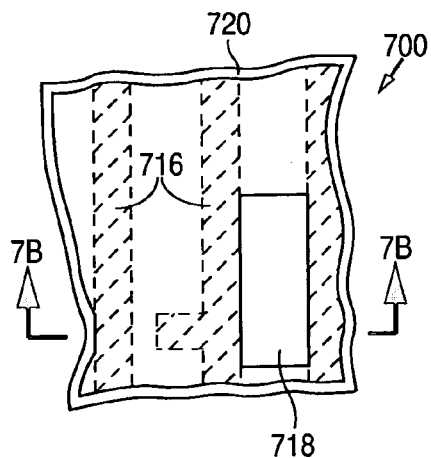

FIGS. 7A-12A show plan views that illustrate a method of forming a metal multilayer interconnect in accordance with a second alternate embodiment of the present invention. FIGS. 7B-12B show cross-sectional drawings taken along lines 7B-7B to 12B-12B shown in FIGS. 7A-12A, respectively. As shown in FIGS. 7A and 7B, the method utilizes an interconnect 700 that is conventionally formed on a semiconductor substrate 710.

Interconnect 700 includes a first layer of isolation material 712 that is formed on substrate 710, and a number of contacts 714 that are formed through isolation layer 712. Contacts 714 provide an electrical connection to active regions on the surface of substrate 710. Interconnect 700 also includes a patterned first metal (metal-1) layer 716 that is formed on isolation layer 712 and contacts 714. In the FIGS. 7A-7B example, patterned metal-1 layer 716 includes a first metal line 716A, a second metal line 716B, and a third metal line 716C. In addition, a first space 717A is defined to lie horizontally entirely between the first and second metal lines 716A and 716B, and a second space 717B is defined to lie horizontally entirely between the second and third metal lines 716B and 716C. Further, interconnect 700 includes a layer of insulation material 718 that is formed on isolation layer 712 and patterned metal-1 layer 716.

Figure 8A:
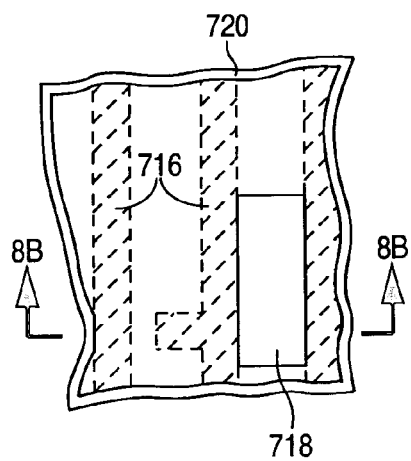
Figure 7B:
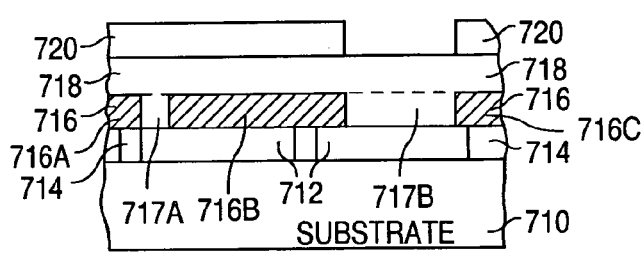
Figure 8B:
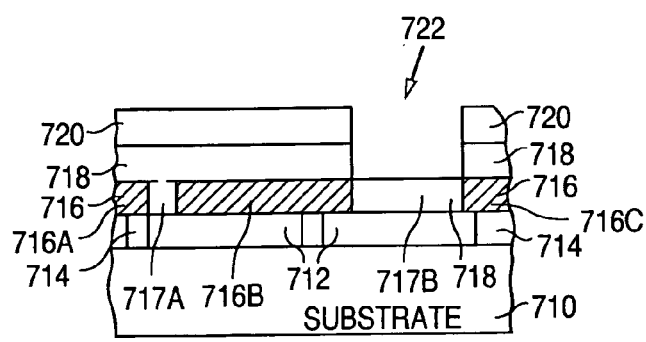

As further shown in FIGS. 7A-7B, the method begins by forming a layer of masking material 720 on insulation layer 718. Once formed, masking layer 720 is patterned to expose a capacitor region on the surface of insulation layer 718. Following this, as shown in FIGS. 8A-8B, the exposed region of insulation layer 718 is anisotropically etched to form a first trench 722. (Care must be taken not to etch into substrate 710.) After the etch, masking layer 720 is removed.

Figure 9A:
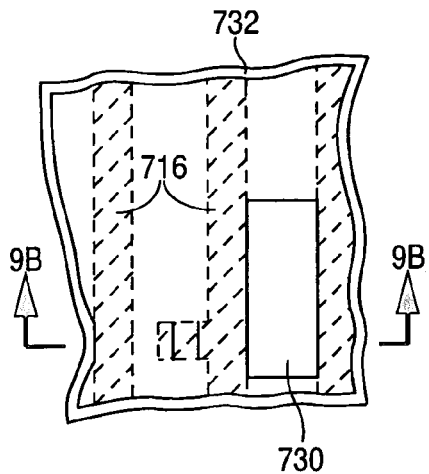
Figure 9B:
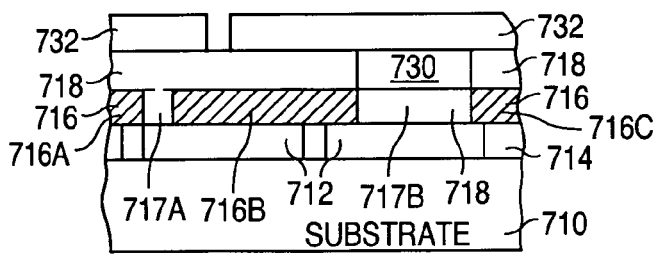

Following this, as shown in FIGS. 9A-9B, a layer of dielectric material, such as oxide, is formed on insulation layer 718 to fill up trench 722, and then etched back to form a dielectric region 730 through insulation layer 718. Dielectric region 730 alters the cross-coupled capacitance Cc. Next, a via mask 732 is formed and patterned on insulation layer 718 and dielectric region 730. Following this, the method continues with conventional steps.

Figure 10A:
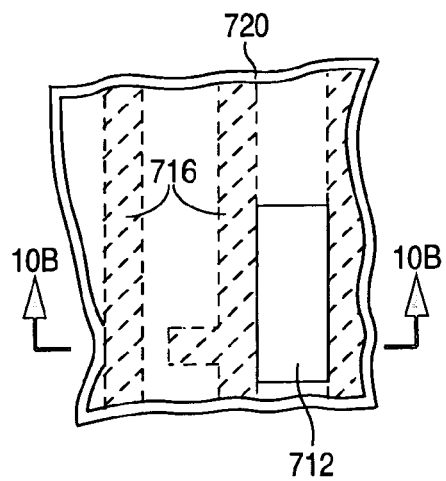
Figure 10B:
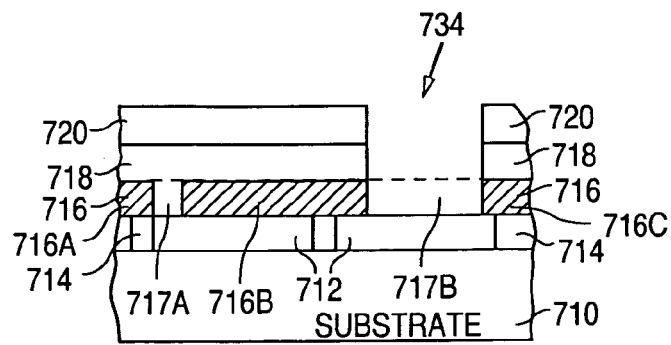
Figure 11A:
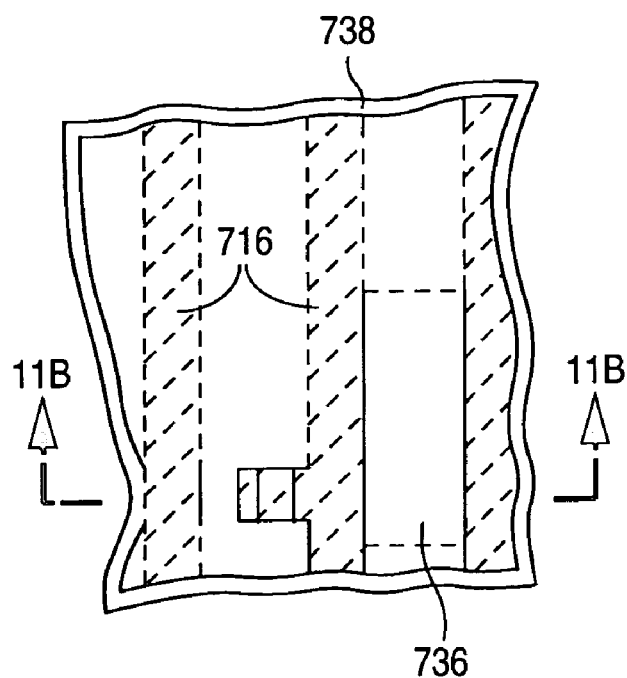
Figure 11B:
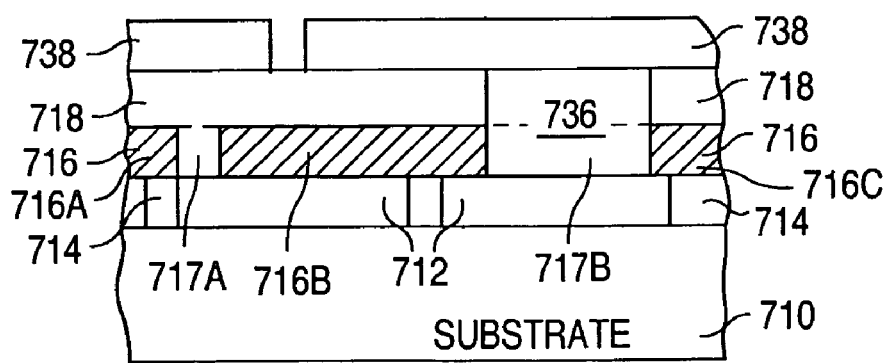

Alternately, as shown in FIGS. 10A-10B, the etching step can be continued for a longer period of time to form a second trench 734. Following the etch, mask 720 is removed. Next, as shown in FIGS. 11A-11B, a layer of dielectric material, such as oxide, is formed on isolation layer 712, insulation layer 718, and patterned metal-1 layer 716 to fill up trench 734. The layer of dielectric material is then etched back to form a dielectric region 736 through insulation layer 718 and between the metal lines of metal-1 layer 716. Dielectric region 736 alters the line-to-line capacitance Ca and the cross-coupled capacitance Cc. Following this, a via mask 738 is formed and patterned on insulation layer 718 and dielectric region 736.

After via mask 738 has been formed, the method continues with conventional back end processing steps. Although the method describes the formation of dielectric regions 730 and 736, a number of dielectric regions can be formed between the metal lines of any patterned metal layer.

Figure 12A:
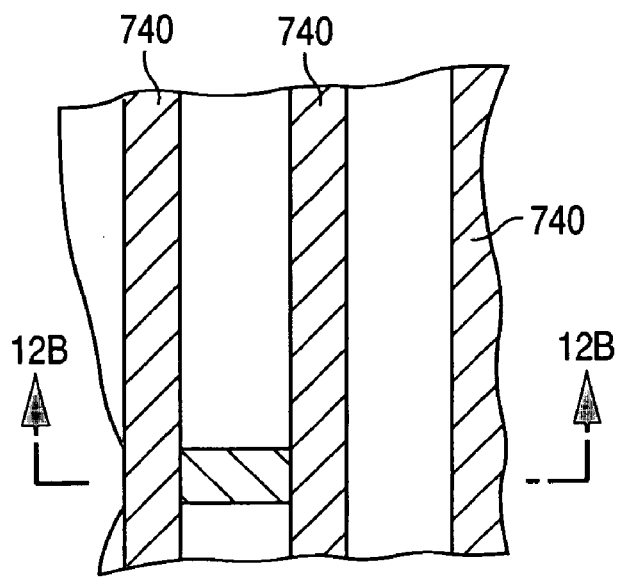
Figure 12B:
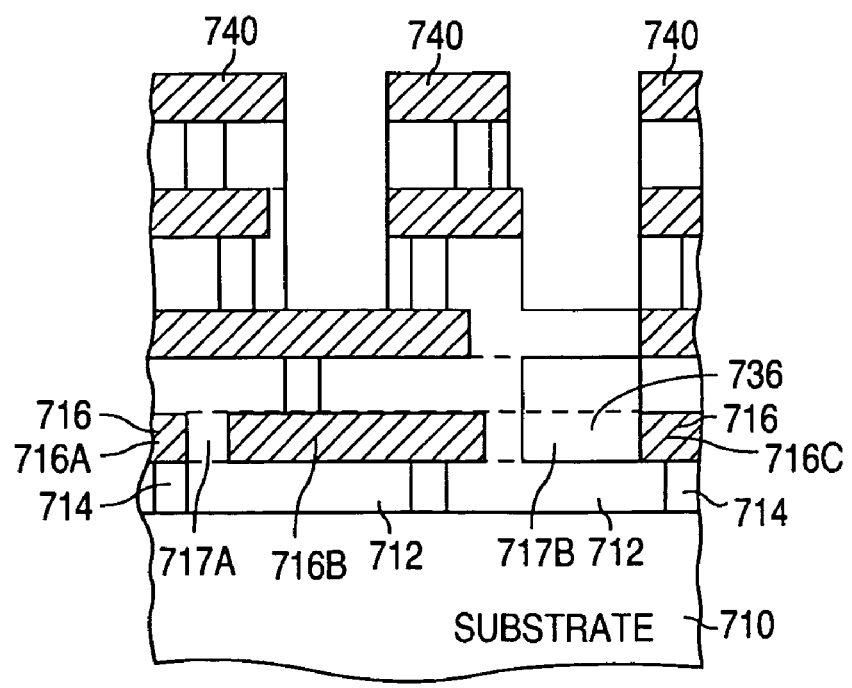

Further, as shown in FIGS. 12A-12B, when a top patterned metal layer 740 has been formed, the resulting interconnect can be anisotropically etched for a predetermined period of time that is insufficient to reach region 736 (or 730), or masked to protect region 736 (or 730) and anisotropically etched for a predetermined period of time.

Thus, a multilevel, metal interconnect and method of forming the structure according to the present invention have been described. The present invention reduces the capacitance related to the interconnect of any CMOS, BiCMOS, or bipolar integrated circuit that includes a multilevel metal interconnect by eliminating a portion of the interconnect dielectric material therein, thereby decreasing the line-to-line capacitance Ca and the cross coupled Cc capacitance components. In addition, the present invention allows capacitance to be selectively added to tune interconnect 300 with respect to the electrical circuit formed on the underlying substrate.

It should be understood that various alternatives to the embodiments of the invention described herein may be employed in practicing the invention. For example, the present invention applies equally to a dual damascene process. It is intended that the following claims define the scope of the invention and that structures and methods within the scope of these claims and their equivalents be covered thereby.

What is claimed is:

1. A method of forming a metal interconnect structure on a semiconductor substrate, the method comprising:

etching an isolation structure in the metal interconnect structure to form a trench in the metal interconnect structure, the metal interconnect structure having a first pair of horizontally adjacent metal traces that lie above a top surface of the semiconductor substrate, and a second pair of horizontally adjacent metal traces that lie above the first pair of horizontally adjacent metal traces, the trench lying between the first pair of horizontally adjacent metal traces, lying between the second pair of horizontally adjacent metal traces, and extending continuously from a point between the first pair of horizontally adjacent metal traces to a point between the second pair of horizontally adjacent metal traces, the isolation structure lying laterally between and touching the first pair of horizontally adjacent metal traces before the trench is formed, and lying between a metal trace of the first pair of horizontally adjacent metal traces and a metal trace of the second pair of horizontally adjacent metal traces;

forming a dielectric structure in the trench, the dielectric structure in the trench touching the isolation structure, lying between the first pair of horizontally adjacent metal traces, lying between the second pair of horizontally adjacent metal traces, and extending continuously from a point between the first pair of horizontally adjacent metal traces to a point between the second pair of horizontally adjacent metal traces, the dielectric structure that only lies directly between the second pair of horizontally adjacent metal traces lying directly vertically above and spaced apart from the dielectric structure that only lies directly between the first pair of horizontally adjacent metal traces; and etching the dielectric structure to remove the dielectric structure that lies directly between the second pair of horizontally adjacent metal traces, and leave the dielectric structure that lies directly between the first pair of horizontally adjacent metal traces.

2. The method of claim 1 wherein the trench exposes a side wall of a metal trace of the second pair of horizontally adjacent metal traces.

3. The method of claim 1 wherein both the isolation structure and the dielectric structure lie directly between the first pair of horizontally adjacent metal traces.

4. The method of claim 1 wherein the dielectric structure includes multiple types of dielectric.

5. The method of claim 1 wherein a bottom surface of the trench is spaced apart from the top surface of the semiconductor substrate.

6. The method of claim 1 wherein the dielectric structure fills up the trench when the dielectric structure is formed in the trench.

7. The method of claim 1 wherein a metal line touches the isolation structure and lies above and spaced apart from a metal trace of the second pair of horizontally adjacent metal traces.

8. The method of claim 1 wherein the trench exposes a top surface of the metal line a metal trace of the second pair of horizontally adjacent metal traces.

9. A method of forming a metal interconnect structure on a semiconductor substrate, the method comprising:

etching an isolation structure in the metal interconnect structure to form a plurality of trenches in the metal interconnect structure, the metal interconnect structure having a first pair of horizontally adjacent metal traces that lie above a top surface of the semiconductor substrate, and a second pair of horizontally adjacent metal traces that lie above the first pair of horizontally adjacent metal traces, a first trench of the plurality of trenches lying between the first pair of horizontally adjacent metal traces, a second trench of the plurality of trenches lying between the second pair of horizontally adjacent metal traces, the isolation structure lying laterally between and touching the first pair of horizontally adjacent metal traces before the plurality of trenches are formed, and lying between a metal trace of the first pair of horizontally adjacent metal traces and a metal trace of the second pair of horizontally adjacent metal traces;

simultaneously forming a dielectric structure in the plurality of trenches, the dielectric structure in the first trench touching the isolation structure and lying between the first pair of horizontally adjacent metal traces, the dielectric structure in the second trench touching the isolation structure and lying between the second pair of horizontally adjacent metal traces, the dielectric structure that only lies directly between the second pair of horizontally adjacent metal traces lying above and spaced apart from the dielectric structure that only lies directly between the first pair of horizontally adjacent metal traces; and etching the dielectric structure to remove the dielectric structure that lies directly between the second pair of horizontally adjacent metal traces, and leave the dielectric structure that lies directly between the first pair of horizontally adjacent metal traces.

10. The method of claim 9 wherein the first trench exposes a side wall of a metal trace of the first pair of horizontally adjacent metal traces.

11. The method of claim 9 wherein the dielectric structure includes multiple types of dielectric.

12. The method of claim 9 wherein etching the dielectric structure includes:

simultaneously etching the dielectric structure in the first trench and the second trench;

forming a mask to cover the first trench after the first trench and the second trench have been simultaneously etched; and etching the dielectric structure in the second trench after the mask has been formed.

13. The method of claim 9 wherein the plurality of trenches are formed with a single etch.

14. The method of claim 9 wherein both the isolation structure and the dielectric structure lie directly between the first pair of horizontally adjacent metal traces.

15. The method of claim 9 wherein a bottom surface of a trench of the plurality of trenches is spaced apart from the top surface of the semiconductor substrate.

16. The method of claim 9 wherein the dielectric structure fills up the plurality of trenches when the dielectric structure is formed.

17. The method of claim 9 wherein a bottom surface of a trench of the plurality of trenches exposes a top surface of a metal line.

* * * * *

UNITED STATES PATENT AND TRADEMARK OFFICE
CERTIFICATE OF CORRECTION

PATENT NO.       : 7,790,602 B1
APPLICATION NO.  : 11/372830
DATED            : September 7, 2010
INVENTOR(S)      : Visvamohan Yegnashankaran et al.

It is certified that error appears in the above-identified patent and that said Letters Patent is hereby corrected as shown below:

Column 4, line 7 delete "second metal line 3166" and replace with --second metal line 316B--. The correct text appears on page 7, line 12 of the originally-filed specification.

Column 4, line 10 delete "second space 3186" and replace with --second space 318B--. The correct text appears on page 7, line 15 of the originally-filed specification.

Column 4, line 14 delete "line 3166" and replace with --line 316B--. The correct text appears on page 7, line 18 of the originally-filed specification.

Claim 8, line 2, delete "the metal line". The correct text appears on page 4, claim 31, line 2 of the amendment filed on March 14, 2010. (Claim 31 was renumbered as patent claim 8.).

Signed and Sealed this

Sixteenth Day of November, 2010

David J. Kappos
*Director of the United States Patent and Trademark Office*

UNITED STATES PATENT AND TRADEMARK OFFICE
CERTIFICATE OF CORRECTION

PATENT NO. : 7,790,602 B1  Page 1 of 1
APPLICATION NO. : 11/372830
DATED : September 7, 2010
INVENTOR(S) : Visvamohan Yegnashankaran et al.

It is certified that error appears in the above-identified patent and that said Letters Patent is hereby corrected as shown below:

Column 4, line 7 delete "second metal line 3166" and replace with --second metal line 316B--.

Column 4, line 10 delete "second space 3186" and replace with --second space 318B--.

Column 4, line 14 delete "line 3166" and replace with --line 316B--.

Column 7, line 65 (Claim 8, line 2), delete "the metal line".

This certificate supersedes the Certificate of Correction issued November 16, 2010.

Signed and Sealed this

Fourteenth Day of December, 2010

David J. Kappos
*Director of the United States Patent and Trademark Office*